United States Patent [19]

Yamamoto

[11] 4,297,428

[45] Oct. 27, 1981

[54] PROCESS FOR MAKING DIAZO PHOTOSENSITIVE PAPER

[76] Inventor: Kaneo Yamamoto, 4-1, Hirata-Kita-machi, Ashiya-shi, Hyogo-ken, Japan

[21] Appl. No.: 134,139

[22] Filed: Mar. 26, 1980

[30] Foreign Application Priority Data

Nov. 5, 1979 [JP] Japan .................................. 54-141997

[51] Int. Cl.$^3$ ........................... G03C 1/86; G03C 1/60
[52] U.S. Cl. ..................................... 430/169; 430/176; 430/177; 430/179; 430/512
[58] Field of Search ............... 430/157, 177, 179, 148, 430/169, 176, 512

[56] References Cited

U.S. PATENT DOCUMENTS 2,657,140 10/1953 Kessels ................................. 430/149
3,365,293 1/1968 Haefeli et al. ........................ 430/179

OTHER PUBLICATIONS

Kosar, J., "Light-Sensitive Systems", J. Wiley & Sons, 1965, pp. 292-296.

Primary Examiner—Charles L. Bowers, Jr.
Attorney, Agent, or Firm—Wenderoth, Lind & Ponack

[57] ABSTRACT

A process for making a diazo photosensitive paper which comprises adding a specified ultraviolet absorber to a photosensitive layer consisting of a diazonium salt and a coupler, adding the ultraviolet absorber to ethyl acetate to prepare a solution, dispersing said solution in an aqueous solution containing specified amounts of sulfosuccinate and polyvinyl alcohol, evaporating the ethyl acetate contained therein, mixing the thus-prepared liquid with a photosensitive liquid in a specified amount, and applying the photosensitive liquid containing the ultraviolet absorber to a paper substrate.

6 Claims, No Drawings

PROCESS FOR MAKING DIAZO PHOTOSENSITIVE PAPER

The present invention relates to binary diazo photosensitive paper used in a diazo-type process. More particularly, the invention relates to a process for making diazo photosensitive paper, wherein the discoloration of the texture of a copy made therefrom is prevented.

BACKGROUND OF THE INVENTION

The texture of a copy made from a diazo photosensitive paper tends to discolor into yellowish brown as a result of aging. This is mainly because the coupler particularly existing in the texture is oxidized by the oxygen in the air and is changed into a colored substance, said oxidation being remarkably promoted by ultraviolet rays.

The addition of an antioxidant, especially thiourea, to a photosensitive layer in order to prevent this discoloration has been known (J. Kosar, "Light Sensitive System", page 294), which is broadly adopted in preparation of an existing diazo photosensitive layers; however, the prevention of discoloration by adding such antioxidants is insufficient.

It is effective to cover the surface of a photosensitive layer with an ultraviolet absorber or to add said absorber into said layer for intercepting ultraviolet rays, which promote discoloration; but since the former requires an extra step, it is desirable to adopt the latter method. However, since almost all the effective ultraviolet absorbers are insoluble in water, it is not possible to add them to a general aqueous photosensitive liquid. In the case where aqueous dispersions of ultraviolet absorbers are used and then added to a photosensitive liquid, the dispersing agent tends to produce harmful effects on the photosensitive composition, causing lowering of the photosensitive effects, chromophoric properties as well as lowering of the color concentration and shelf life of the photosensitive paper. Also, the dispersing agent tends to cause hindrance, such as white spots and stripes, brought about by liquid repulsion, when the liquid is applied to the surface of a copy and further it is difficult to prepare a stable paint to be applied thereto.

DETAILED DESCRIPTION OF THE INVENTION

As a result of various studies, the present inventor has found that with reference to a process for preparing an aqueous dispersion and adding the proper amount of the dispersion, the following process is suitable.

The present invention relates to a process for making diazo photosensitive paper, which comprises adding an ultraviolet absorber to a photosensitive layer consisting of a diazonium salt and a coupler, characterized in that:

(a) said ultraviolet absorber is a benzotriazole derivative represented by the general formula

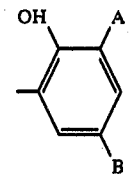
(I)

(wherein R is

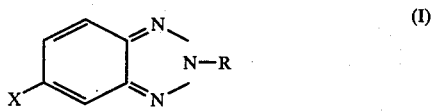

(wherein each of A and B denotes H or an alkyl group having 1–5 carbon atoms) and X denotes H or Cl), (b) said agent represented by the general formula (I) is mixed with ethyl acetate so as to prepare a 3–10% (by weight) solution of the ultraviolet absorber in the ethyl acetate. 10 parts of said solution is dispersed in 15–20 parts of an aqueous solution containing 1–3% of sulfosuccinate and 0.1–1% of polyvinyl alcohol and the ethyl acetate contained therein is evaporated and (c) preparing a liquid mixture obtained by adding said ultraviolet absorber containing solution to a photosensitive liquid consisting of the diazonium compound and the coupler so that the amount of said agent represented by said formula (I) contained therein is about 15–50% of the amount of the coupler contained in the photosensitive liquid and applying the liquid mixture to a paper substrate to prevent discoloration of the texture of a copy of said paper.

According to the process of the present invention, such hindrance as mentioned above does not occur and the thus obtained photosensitive paint is stable.

Specific examples of the ultraviolet absorber will be shown below.

2-(2'-hydroxy-3', 5'-ditertiary amyl phenyl)-2H-benzotriazole
2-(2'-hydroxy-5'-methyl phenyl)-2H-benzotriazole
2-(2'-hydroxy-5'-tertiary butylphenyl)-2H-benzotriazole
2-(2'-hydroxy-3'-tertiary butyl-5'-methyl phenyl)-5-chloro-2H-benzotriazole
2-(2'-hydroxy-3', 5'-ditertiary butyl phenyl)-5-chloro-2H-benzotriazole Ethyl acetate used in the present invention may be substituted by methyl acetate and methylethyl ketone.

As the diazonium compound used in the present invention, a generally used compound for binary diazo photosensitive paper may be used. Examples of such diazonium compound will be cited below.

4-diazo-N, N-dimethyl aniline
4-diazo-N,N-diethyl aniline
4-diazo-N-ethyl-N-hydroxyethyl aniline
4-diazo-2,5-diethoxy-phenyl morpholine
4-diazo-2,5-dipropoxy phenyl morpholine
4diazo-2,5-dibutoxy phenyl morpholine As the coupler used in the present invention, a compound generally used for binary diazo photosensitive paper may be used, examples thereof will be cited below.

2,3-dihydroxy naphthalene
2,3-dihydroxy naphthalene-6-sodium sulfonate
2-hydroxy-3-naphthoic acid-diethylamino ethyl amide
2-hydroxy-3-naphthoic acid morpholino propylamide
resorcin Various additives used as photosensitive paint such as, for example, an acid stabilizer, an antioxidant, a color assistant and an extender may be used without harmful effects in the present invention.

Hereinbelow, an example of the present invention will be cited.

EXAMPLE

In 50 g of ethyl acetate was dissolved 3 g of 2-(2'-hydroxy-3', 5'-ditertiary amyl phenyl)-2H-benzotriazole (Tinuvin 328; Tradename Nihon Ciba Geigy Kabushiki Kaisha). The resulting solution was dispersed into a mixture obtained by adding 56 g of water to 6 g of polyvinyl alcohol (a 5% aqueous solution) and 30 g of sulfosuccinate (Airrol OP; Tradename, Toho Chemical Industry Co. Ltd.) (a 5% aqueous solution) and mixed to dissolve the latter materials in the water. The resultant aqueous solution was vigorously stirred with a homogenizer and dispersed. In an open container was placed 20 g of this dispersion and the ethyl acetate contained in the dispersion was evaporated; however, the dispersion was kept intact. The weight thereof was 12 g.

A diazo photosensitive liquid was prepared in accordance with the following prescription.

Namely, 2 g of citric acid, 3 g of triethylene glycol, 2 g of thiourea, 2 g of 2,3-dihydroxy naphthalene-6-sodium sulfonate, 1.5 g of a 4-diazo-N-ethyl-N-hydroxy ethyl aniline zinc chloride double salt, 2.5 g of zinc chloride, 0.02 g of saponin and water were mixed together, the total weight being 100 g. To this photosensitive liquid was added the aforesaid dispersion and the resultant dispersion was applied to the base paper of a photosensitive paper to prepare a diazo photosensitive paper.

For the purpose of comparison, two kinds of photosensitive paper were prepared from what was obtained by adding 12 g of water only to the diazo photosensitive liquid and what was obtained by adding the dispersion short of "Tinuvin", respectively.

When each of three kinds of photosensitive paper was developed with ammonia vapor after exposing an image, a copy of a blue image was obtained in each case. When the texture of each of these copies was subjected to a discoloration test with a high-pressure mercury lamp according to JISK 7012, the concentration of the texture became as follows:

|  | Prior to irradiation | After irradiation |
|---|---|---|
| Example | 0.13 | 0.13 |
| What was removed of "Tinuvin" | 0.13 | 0.15 |
| What was added with water only | 0.13 | 0.15 |

Thus, it is seen that the present invention is effective.

What is claimed is:

1. In a process for making an acid stabilized diazo photosensitive paper which comprises adding an ultraviolet absorber to an acid stabilized diazo photosensitve layer on a paper substrate, said layer consisting essentially of a diazonium salt and a coupler, the improvement wherein said ultraviolet absorber is a benzotriazole derivative represented by the general formula (1)

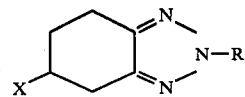

wherein R denotes

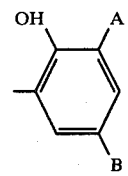

wherein each of A and B denotes H or an alkyl group having 1-5 carbon atoms and X denotes H or Cl, (a) mixing said ultraviolet absorber represented by the general formula (I) with a solvent selected from the group consisting of ethyl acetate, methyl acetate and methylethyl ketone, so as to prepare a 3–10% by weight solution of the ultraviolet absorber in the solvent, dispersing 10 parts of said solution in 15–20 parts of an aqueous solution containing 1–3% of sulfosuccinate and 0.1–1% of polyvinyl alcohol and evaporating the ethylacetate, methyl acetate or methylethyl ketone, therefrom, (b) mixing the thus-prepared solution with a photosensitive liquid consisting of diazonium compound and a coupler so that the amount of said ultraviolet absorber represented by said formula (I) contained therein is 15–50% of the amount of the coupler contained in the photosensitive liquid, and, (c) applying the photosensitive liquid containing the ultraviolet absorber to a paper substrate to prevent discoloration of the texture of a copy of said paper.

2. A process according to claim 7, wherein said ultraviolet absorber is 2-(2'-hydroxy-3',5'-ditertiary amyl phenyl)-2H-benzotriazole.

3. A process according to claim 7, wherein said ultraviolet absorber is 2-(2'-hydroxy-5'-methyl phenyl)-2H-benzotriazole.

4. A process according to claim 7, wherein said ultraviolet absorber is 2-(2'-hydroxy-5'-tertiary butyl phenyl)-2H-benzotriazole.

5. A process according to claim 7, wherein said ultraviolet absorber is 2-(2'-hydroxy-3'-tertiary butyl-5'-methyl phenyl)-5-chloro-2H-benzotriazole.

6. A process according to claim 7, wherein said ultraviolet absorber is 2-(2'-hydroxy-3',5'-ditertiary butyl phenyl)-5-chloro-2H-benzotriazole.

* * * * *